(12) United States Patent
Porst

(10) Patent No.: US 11,493,553 B2
(45) Date of Patent: Nov. 8, 2022

(54) EXTENDED JTAG CONTROLLER AND METHOD FOR FUNCTIONAL RESET USING THE EXTENDED JTAG CONTROLLER

(71) Applicant: COMMSOLID GMBH, Dresden (DE)

(72) Inventor: Uwe Porst, Dresden (DE)

(73) Assignee: COMMSOLID GMBH, Dresden (DE)

( * ) Notice: Subject to any disclaimer, the term of this patent is extended or adjusted under 35 U.S.C. 154(b) by 23 days.

(21) Appl. No.: 17/269,005

(22) PCT Filed: Aug. 22, 2018

(86) PCT No.: PCT/EP2018/072633
§ 371 (c)(1),
(2) Date: Feb. 17, 2021

(87) PCT Pub. No.: WO2020/038570
PCT Pub. Date: Feb. 27, 2020

(65) Prior Publication Data
US 2021/0325461 A1    Oct. 21, 2021

(51) Int. Cl.
*G01R 31/3185* (2006.01)
*G01R 31/317* (2006.01)
*G01R 31/319* (2006.01)

(52) U.S. Cl.
CPC ........... *G01R 31/318555* (2013.01); *G01R 31/31701* (2013.01); *G01R 31/31725* (2013.01);
(Continued)

(58) Field of Classification Search
CPC ...... G01R 31/318555; G01R 31/31701; G01R 31/31725; G01R 31/318544; G01R 31/31926; G01R 31/318575
(Continued)

(56) References Cited

U.S. PATENT DOCUMENTS 5,574,733 A * 11/1996 Kim ............... G01R 31/318547
714/739
6,662,327 B1 * 12/2003 Rajski ............. G01R 31/31813
714/739
(Continued)

OTHER PUBLICATIONS

International Search Report and Written Opinion issued in PCT/EP2018/072633 dated May 6, 2019.
(Continued)

*Primary Examiner* — John J Tabone, Jr.
(74) *Attorney, Agent, or Firm* — Heslin Rothenberg Farley & Mesiti P.C.; Kevin P. Radigan, Esq.

(57) ABSTRACT

An extended joint test action group based controller and a method of use allows easier testing of integrated circuits by reducing the power dissipation of an IC. The extended joint test action group (JTAG) controller tests internal storage elements that form digital units in an integrated circuit (IC) use a design for testing scan infrastructure on the IC, wherein the JTAG controller is extended by an overall reset generator for all digital units of the IC, and a finite state machine controls the overall reset generator. In reset mode the JTAG controller stops the at least one clock module in supplying the digital units that should be reset. It then sets all scan chains in test mode and switches the input multiplexers into reset mode; and then controls the number of shift clock cycles for shifting in the reset value to the flip-flops in the scan chain, respectively.

18 Claims, 2 Drawing Sheets

(52) U.S. Cl.
CPC .............. *G01R 31/31926* (2013.01); *G01R 31/318544* (2013.01)

(58) Field of Classification Search
USPC .................. 714/727, 726, 729, 731
See application file for complete search history.

(56) References Cited

U.S. PATENT DOCUMENTS

| | | | | |
|---|---|---|---|---|
| 7,644,333 | B2* | 1/2010 | Hill ............... | G01R 31/318547 714/732 |
| 7,788,558 | B2* | 8/2010 | Shimooka ...... | G01R 31/318536 714/726 |
| 8,933,447 | B1* | 1/2015 | Rahman ......... | G01R 31/318513 257/797 |
| 9,009,552 | B2* | 4/2015 | Kwan ............ | G01R 31/318575 714/726 |
| 2002/0073373 | A1* | 6/2002 | Nakao ................... | G11C 29/10 714/728 |
| 2002/0138801 | A1* | 9/2002 | Wang ............... | G01R 31/31705 714/729 |
| 2003/0115525 | A1* | 6/2003 | Hill ............... | G01R 31/318547 714/726 |
| 2006/0156099 | A1* | 7/2006 | Sweet ............. | G01R 31/31705 714/724 |
| 2006/0161826 | A1* | 7/2006 | Ghisiawan ..... | G01R 31/318533 714/726 |
| 2006/0168490 | A1* | 7/2006 | McCormack .. | G01R 31/318544 714/726 |
| 2007/0011525 | A1* | 1/2007 | Suzuki .......... | G01R 31/318536 714/726 |
| 2008/0092002 | A1* | 4/2008 | Shimooka ...... | G01R 31/318536 714/E11.155 |
| 2009/0158105 | A1* | 6/2009 | Konda .................. | G06F 11/267 714/E11.159 |
| 2009/0193305 | A1* | 7/2009 | Liu ................ | G01R 31/318555 714/E11.155 |
| 2011/0148445 | A1* | 6/2011 | Zivkovic ........ | G01R 31/318508 324/750.3 |
| 2014/0082421 | A1* | 3/2014 | Marinissen .... | G01R 31/318575 714/34 |
| 2015/0276866 | A1 | 10/2015 | Jindal | |
| 2015/0295560 | A1 | 10/2015 | Pal et al. | |
| 2016/0077155 | A1* | 3/2016 | Whetsei ........ | G01R 31/318555 714/727 |
| 2016/0349320 | A1* | 12/2016 | Laisne ............ | G01R 31/31724 |
| 2017/0097388 | A1* | 4/2017 | Parasrampuria ............................ G01R 31/318547 | |
| 2018/0340977 | A1* | 11/2018 | Chakraborty .... | G01R 31/31727 |
| 2019/0018731 | A1* | 1/2019 | Schat ................ | G01R 31/3181 |
| 2021/0325461 | A1* | 10/2021 | Porst ............. | G01R 31/318544 |
| 2022/0120809 | A1* | 4/2022 | Porst ................ | G01R 31/31705 |

OTHER PUBLICATIONS

Guo Jian-Min et al., "A functional enhancement methodology to JTAG controller in complex SOC"Computer Science & Education, Jul. 25, 2009, ICCSE, 4th International Conference on IEEE, pp. 1128-1131, Piscataway, N.J., USA.

* cited by examiner

EXTENDED JTAG CONTROLLER AND METHOD FOR FUNCTIONAL RESET USING THE EXTENDED JTAG CONTROLLER

CROSS REFERENCE TO RELATED APPLICATIONS

This application is the National Phase filing under 35 U.S.C. § 371 of International Application No.: PCT/EP2018/072633, filed on Aug. 22, 2018. The contents of this prior application is hereby incorporated by reference herein in its entirety.

The invention discloses an extended joint test action group based controller and a method using the extended joint test action group based controller.

BACKGROUND ART

Figure 1:
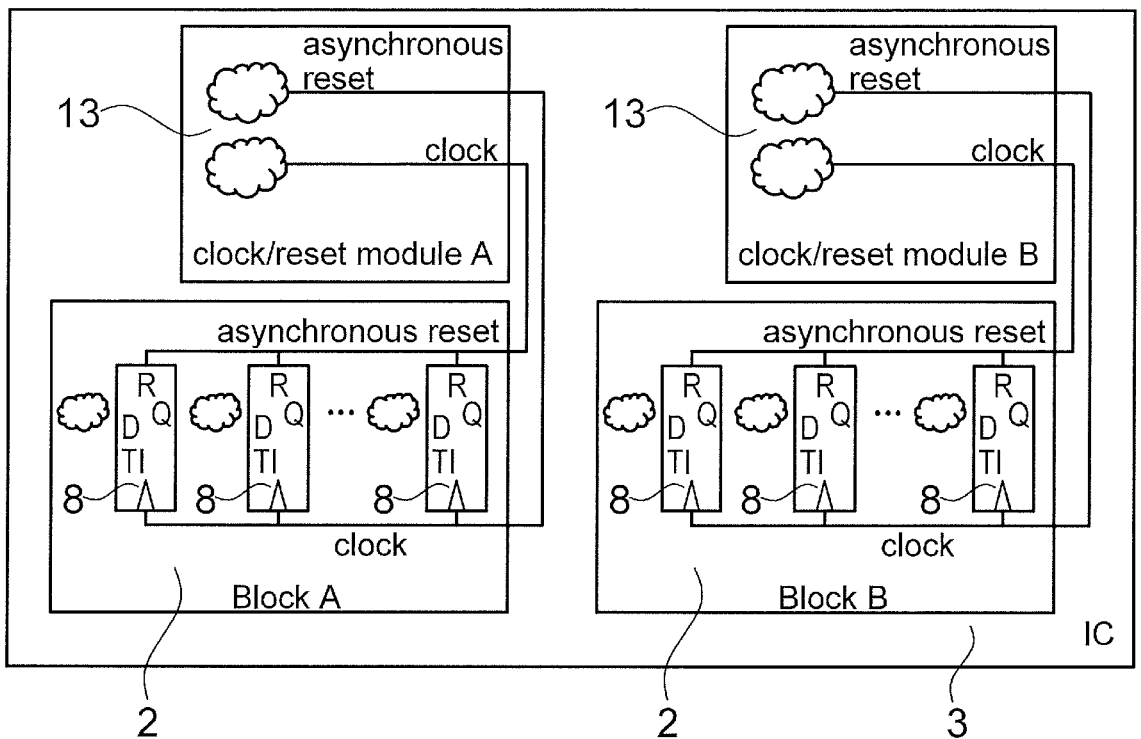

Digital blocks or digital units of an integrated circuit (IC) requires clock and asynchronous reset supplies because they consists of internal storage elements such as latches or flip-flops. Typically the clock and the asynchronous reset supply are done by a clock/reset module as shown in FIG. 1. An IC can have at least one clock/rest module or multiple of them.

Each IC requires design for testing (DfT) structures for production test ensuring that the full functionality of the produced IC is available. Hence, a design for testing scan structure comprises IC design techniques that add testability features to a hardware product design. The added features make it easier to develop and apply manufacturing tests to the designed hardware. The purpose of manufacturing tests is to validate that the product hardware contains no manufacturing defects that could adversely affect the product's correct functioning. Tests can be applied at several steps in the hardware manufacturing flow and may also be used for hardware maintenance in the customer's environment. The tests are generally driven by test programs for finding and indicating the presence of defects (i.e. the test fails), tests may be able to log diagnostic information about the nature of the encountered test fails. The diagnostic information can be used to locate the source of the failure. In other words, the response of vectors (patterns) from a good circuit is compared with the response of vectors (using the same patterns) from a device under test (DUT). If the response is the same or matches, the circuit is good. Otherwise, the circuit is not manufactured as it was intended.

Figure 2:
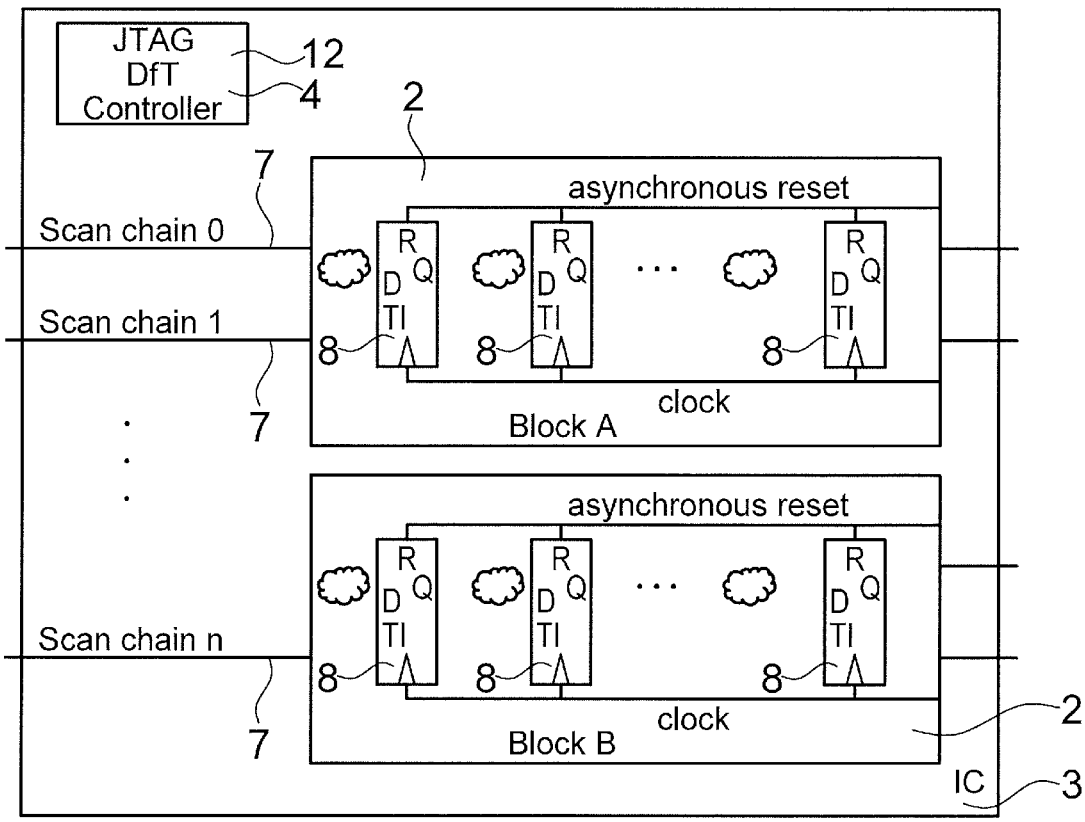

One part of the design for test is a scan-test, another part is BIST—a build in self-test for memory and/or logic. In scan-test a briefed connection between each flip-flop of the subcomponents of the IC is tested. FIG. 2 shows such a design for testing structure. In the scan-test, registers (flip-flops or latches) or digital units in the design are connected in one or more scan chains, which are used to gain access to internal nodes of the IC. A scan chain or a scan structure is a technique used in design for testing. The objective is to make testing easier by providing a simple way to set and observe every internal storage element, such as every flip-flop in an IC. The basic structure of scan includes the following set of signals in order to control and observe the scan mechanism: a) scan_in and scan_out define the input and output of a scan chain. In a full scan mode usually each scan_input drives only one chain and scan_out observe one as well; b) a scan enable pin is a special signal that is added to a design. When this signal is asserted, every flip-flop in the design is connected into a long shift register; c) a clock signal which is used for controlling all the flip-flops in the chain during shift phase and the capture phase. An arbitrary pattern can be entered into the chain of flip-flops, and the state of every flip-flop can be read out.

So, test patterns are shifted in via the scan chain(s), functional clock signals are pulsed to test the circuit during the "capture cycle(s)", and the results are then shifted out to chip output pins and compared against the expected "good machine" results. In addition to being useful for manufacturing "go/no go" testing, scan chains can also be used to "debug" chip designs. In this context, the chip is exercised in normal "functional mode" (for example, a computer or mobile-phone chip might execute assembly language instructions). At any time, the chip clock can be stopped, and the chip re-configured into "test mode". At this point the full internal state can be dumped out, or set to any desired values, by use of the scan chains. Another use of scan to aid debug consists of scanning in an initial state to all internal storage or memory elements and then go back to functional mode to perform system debug. The advantage is to bring the system to a known state without going through many clock cycles. The joint test action group based design for testing controller is the master of the design for testing process.

A clock signal keeps track of the current time in an IC. Clock signals are needed in almost any electronic devices which need to keep accurate time. A clock signal is a particular type of signal that oscillates between a high and a low state and is utilized like a metronome to coordinate actions of digital circuits. A clock signal is produced by a clock generator. Circuits using the clock signal for synchronization may become active at either the rising edge, falling edge, or, in the case of double data rate, both in the rising and in the falling edges of the clock cycle.

The standardized procedure for testing a fabricated IC has the problem that the power dissipation (dynamic and leakage) is very high.

It is therefore the object of the invention to lower the power dissipation but providing the same functionality for ultra-low power IC's.

SUMMARY OF THE INVENTION

The object of the invention will be solved by an extended joint test action group (JTAG) controller for testing internal storage elements that form digital units in an integrated circuit (IC) using a design for testing scan infrastructure on the IC, wherein the JTAG controller is extended by an overall reset generator for all digital units of the IC, whereas a finite state machine controls the overall reset generator.

Internal storage elements are for example latches or flip-flops.

The finite state machine takes over the control of the reset function of the circuit. The sequence of the finite state machine involves switching the input multiplexers (imux) and shifting the reset values through all scan chains. Hence, the finite state machine implicitly controls the number of clock cycles that are needed for the test scan. All scan chains are used simultaneously. At the end of the sequence, the combined JTAG/Reset controller goes into IDLE mode, which saves power.

By merging the design for testing infrastructure with the reset generator inside the joint test action group controller one can simplify the clock/rest modules to a clock module. Therefore, the power dissipation can be lowered, because all flip-flops of a digital block/unit do not need a dedicated reset/set pin. This leads to a smaller footprint of the flip-flops, because a flip flop does not contain set/reset pins, which lead to at least one or more transistor per flip flop. This is the reason for power and area saving. Also the reset tree network, meaning that all digital units need their own reset module, is no longer required which saves a lot of IO buffers. All these measurements lead to area reduction as well as leakage reduction and the same functionality for ultra-low power ICs can be provided at the same time.

In an embodiment of the invention the overall reset generator comprises an asynchronous reset module for each digital unit of the IC. The asynchronous reset module requires a clock signal for releasing the reset, but not for asserting. Because the more critical part is releasing the asynchronous reset due to avoiding recovery violation of a flip-flop.

In another embodiment of the extended JTAG controller the design for testing scan infrastructure comprises scan chains, whereas all scan chains have a same number of flip-flops. This is advantageous, because the scan chains need to be balanced. If the number of flip flops is not balanced, this leads to more test vectors and test time, which increases test costs per part.

In another embodiment of the invention a dummy flip-flop is inserted in a scan chain, if the number of flip-flops in that scan chain is different to the other scan chains. This is necessary to balance the number of flip-flops per scan. If the number of flip-flops is not balanced, this will make the hardware more complex to reset the design. If the scan chains are not balanced, each scan chain requires its own counter instead using one counter for all scan chains.

In a further embodiment of the invention the JTAG controller is connected over input multiplexers to the scan chains. This has the purpose to switch between test mode and functional reset mode. In functional reset mode the initial flip flop states are shifted in, in test mode, a test pattern is shifted in.

In an embodiment of the inventive extended JTAG controller the IC comprises at least one clock module for synchronizing the digital units. Due to the merging of the design for testing infrastructure with the reset generator inside the JTAG controller one can simplify the clock/rest modules to a clock module. Therefore, the power dissipation can be lowered, because all flip-flops of a digital block/unit do not need a dedicated reset/set pin, only a clock module.

The object of the invention will also be solved by a method for functional reset of digital units of an IC using the extended joint test action group (JTAG) controller, wherein in reset mode the JTAG controller
- stops the at least one clock module in supplying the digital units, that should be reset;
- sets all scan chains in test mode;
- switches the input multiplexers into reset mode; and
- controls the number of shift clock cycles for shifting in the reset value to internal storage elements in the scan chain, respectively.

After shifting in the initial values, the scan chains are set back to functional mode and the clock is released back. The JTAG controller has to control the number of clock cycles that are used for shifting in the reset values of the flip-flops.

In an embodiment of the inventive method especially in design of testing mode the JTAG controller controls the input multiplexer, whereas a default value is routed through the scan chains.

Normally all flip-flops of a scan chain should have the same reset value, this makes the design of the JTAG controller less complex. For example: If the scan chain consists of 200 flip-flops, all flip-flops have the reset value 0, 200 times 0 is shifted in. The JTAG controller needs only one counter for the shift clocks.

In order to lower the power dissipation it is preferred if the design of testing mode and the reset mode are performed by the extended JTAG controller as one single hardware component of the IC.

The extended JTAG controller can also be applied to only a subset of modules.

The invention will be explained in more detail using exemplary embodiments.

BRIEF DESCRIPTION OF THE DRAWING FIGURES

Figure 3:
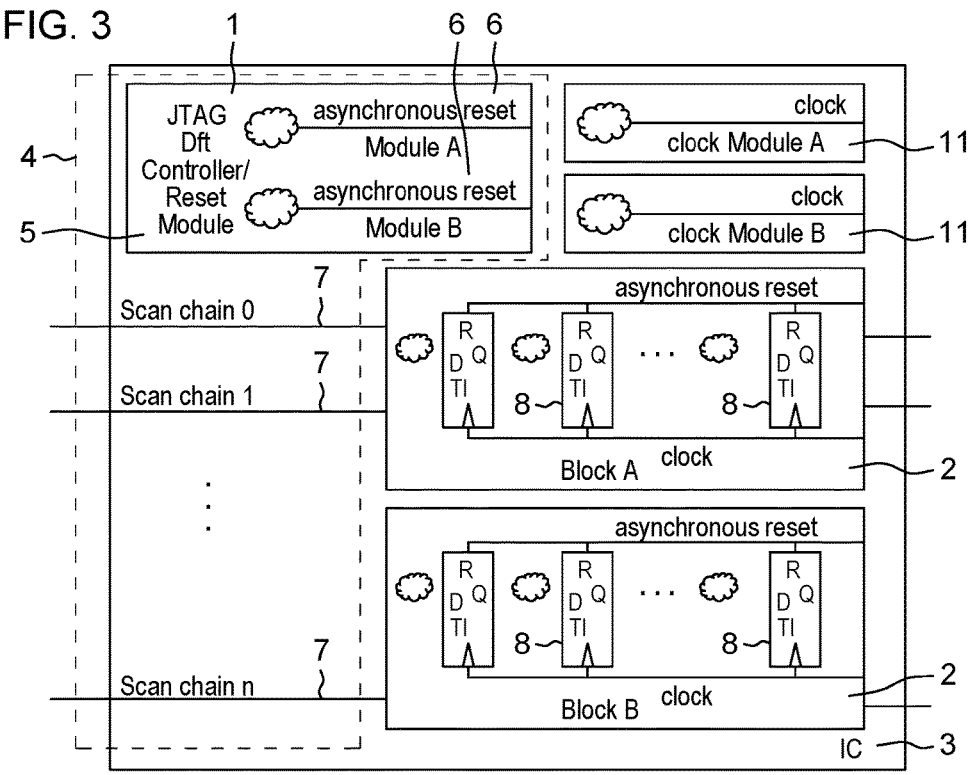
Figure 4:
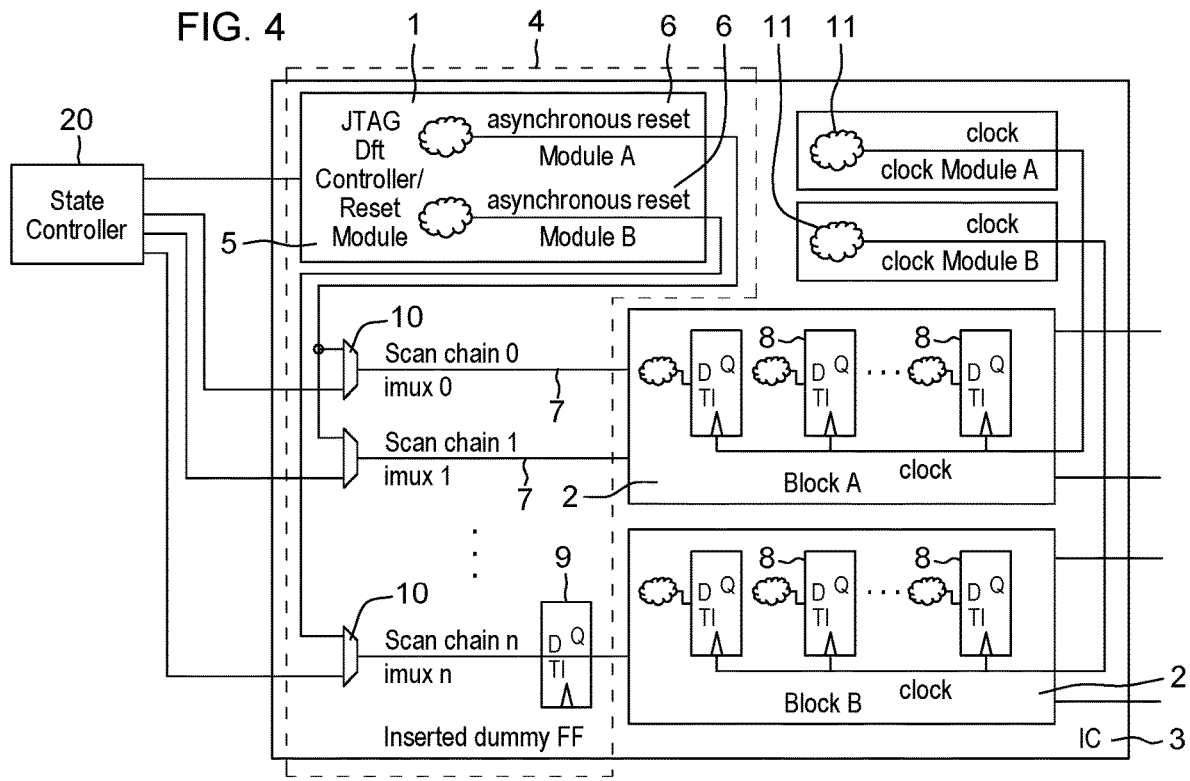

The appended drawings show
FIG. 1 A general clock/reset supply of digital units (state-of-the-art);
FIG. 2 Common design for testing structure in an IC (state-of-the-art);
FIG. 3 Inventive merged infrastructure for testing and resetting with the extended JTAG controller;
FIG. 4 Detailed schematic view of the inventive extended JTAG controller inside an IC.

DETAILED DESCRIPTION

FIG. 3 shows the inventive extended JTAG controller 1 wherein asynchronous reset modules 6 for every digital unit 2 of the IC 3 are inserted within the JTAG controller 1 in order to provide an overall reset generator 5 for the digital units 2 in the IC 3. Therefore, the power dissipation can be lowered, because all flip-flops 8 of a digital block/unit 2 do not need a dedicated reset/set pin. It is no longer required that all digital units 2 need their own reset module which saves a lot of IO buffers. All these measurements lead to area reduction as well as leakage reduction and the same functionality for ultra-low power ICs can be provided at the same time. The clock reset modules 13 for every digital unit 2 can be simplified to a clock module 11.

The merging of the design for testing scan infrastructure 4 with the reset generator 13 in the JTAG controller block 1 lower the power dissipation of the IC 3.

FIG. 4 shows a detailed schematic view of the inventive JTAG controller 1 inside an IC 3. With the reuse of a common JTAG controller for design for testing tasks as well as for functional resetting of digital units 2 it is possible to lower the power dissipation by reducing the number of IO buffers in the IC 3.

The merged joint test action group (JTAG) design for testing/resetting controller fulfils the requirement of the IEEE 1149.1 standard (boundary scan) and IEEE 1500 standard (core wrapper test).

So, the design for test feature set is the same as for a standard DfT control. The design for test feature set in design for test mode controls the input multiplexers (imux's), whereas the default value of the input multiplexer (imux) is routed through the scan chain input. This means, the mux is set in default for design for test (DfT) operation and not for the reset operation. In reset generation mode the selected scan chain is connected to the controller which controls the according input multiplex (imux). This is done by a state controller 20 implementing the finite state machine.

The finite state machine takes over the control of the reset function of the circuit. The sequence of the finite state machine involves switching the input multiplexers (imux)

and shifting the reset values through all scan chains. Hence, the finite state machine implicitly controls the number of clock cycles that are needed for the test scan. All scan chains are used simultaneously. At the end of the sequence, the combined JTAG/Reset controller goes into IDLE mode, which saves power. The same sequence can also be executed step by step via JTAG's OP codes from an external JTAG controller.

For realizing the new extended JTAG controller and method for functional reset using the extended JTAG controller new JTAG op codes for debug mode, input multiplexer control, shift value and shift control of the clock network is needed.

LIST OF REFERENCE SIGNS 1 extended joint action group (JTAG) controller
2 digital unit
3 integrated circuit (IC)
4 design for testing infrastructure
5 overall reset generator
6 asynchronous reset module
7 scan chain
8 flip-flop
9 dummy flip-flop
10 input multiplexer
11 clock module
12 joint action group (JTAG) controller
13 combined clock/reset module

The invention claimed is:

1. A scan infrastructure on an integrated circuit (IC), the scan infrastructure, which is configured as a design for testing (DfT) scan infrastructure, comprising:
digital units which comprise internal storage elements;
a controller meeting an IEEE boundary standard; and
one or more scan chains formed by the digital units:
wherein:
the controller is extended by an overall reset generator for all digital units of the IC to provide an extended controller on the IC, and
a state controller controls the overall reset generator, the overall reset generator comprising an asynchronous reset unit for each digital unit of the IC to provide asynchronous reset control over every digital unit of the IC, and the extended controller merging the design for testing scan infrastructure in a design for testing mode with the reset generator function for testing and resetting the IC.

2. The scan infrastructure according to claim 1, wherein the internal storage elements comprise flip-flops, and all scan chains of the one or more scan chains have a same number of flip-flops.

3. A method for functional reset of the digital units of the IC using the scan infrastructure, which comprises the extended controller according to claim 2, wherein in a reset mode the extended controller
stops an at least one clock module of a plurality of clock modules in supplying the digital units, that should be reset;
sets all scan chains of the one or more scan chains in test mode;
switches input multiplexers into the reset mode; and
controls a number of shift clock cycles for shifting in a reset value to internal storage elements in the scan chain, respectively.

4. The scan infrastructure according to claim 1, wherein the internal storage elements comprise flip-flops, and a dummy flip-flop is inserted in a scan chain, if a number of flip-flops in that scan chain is different to other scan chains.

5. A method for functional reset of the digital units of the IC using the scan infrastructure, which comprises the extended controller according to claim 4, wherein in a reset mode the extended controller
stops an at least one clock module of a plurality of close modules in supplying the digital units, that should be reset;
sets all scan chains of the one or more scan chains in test mode;
switches input multiplexers into the reset mode; and
controls a number of shift clock cycles for shifting in a reset value to internal storage elements in the scan chain, respectively.

6. The method for functional reset of the digital units of the IC according to claim 5, wherein in a design of testing mode the extended controller controls an input multiplexer, wherein a default value is routed through the one or more scan chains.

7. The scan infrastructure according to claim 1, wherein the extended controller is connected by input multiplexers to the one or more scan chains.

8. A method for functional reset of the digital units of the IC using the scan infrastructure, which comprises the extended controller according to claim 7, wherein in a reset mode the extended controller
stops an at least one clock module of a plurality of clock modules in supplying the digital units, that should be reset;
sets all scan chains of the one or more scan chains in test mode;
switches input multiplexers into the reset mode; and
controls a number of shift clock cycles for shifting in a reset value to internal storage elements in the scan chain, respectively.

9. A method for functional reset of the digital units of the IC according to claim 7, wherein in a design of testing mode the extended controller controls an input multiplexer, wherein a default value is routed through the one or more scan chains.

10. The method for functional reset of the digital units of the IC according to claim 9, wherein the design of testing mode and a reset mode are performed by the extended controller as one single hardware component of the IC.

11. The scan infrastructure according to claim 1, wherein the IC comprises at least one clock module for synchronizing the digital units.

12. A method for functional reset of the digital units of the IC using the scan infrastructure, which comprises the extended controller according to claim 11, wherein in a reset mode the extended controller
stops an at least one clock module of a plurality of clock modules in supplying the digital units, that should be reset;
sets all scan chains of the one or more scan chains in test mode;
switches input multiplexers into the reset mode; and
controls a number of shift clock cycles for shifting in a reset value to internal storage elements in the scan chain, respectively.

13. The method for functional reset of the digital units of the IC according to claim 12, wherein in a design of testing mode the extended controller controls an input multiplexer, wherein a default value is routed through the one or more scan chains.

14. The method for functional reset of the digital units of the IC according to claim 13, wherein the design of testing mode and the reset mode are performed by the extended controller as one single hardware component of the IC.

15. A method for functional reset of the digital units of the IC using the scan infrastructure, which comprises the extended controller according to claim 1, wherein in a reset mode the extended controller
- stops an at least one clock module of a plurality of clock modules in supplying the digital units, that should be reset;
- sets all scan chains of the one or more scan chains in test mode;
- switches input multiplexers into the reset mode; and
- controls a number of shift clock cycles for shifting in a reset value to internal storage elements of the digital units in the scan chain, respectively.

16. The method for functional reset of the digital units of the IC according to claim 15, wherein in design of testing mode the extended controller controls an input multiplexer, wherein a default value is routed through the one or more scan chains.

17. The method for functional reset of the digital units of the IC according to claim 15, wherein a design of testing mode and the reset mode are performed by the extended controller as one single hardware component of the IC.

18. The method for functional reset of the digital units of the IC according to claim 16, wherein the design of testing mode and the reset mode are performed by the extended controller as one single hardware component of the IC.

* * * * *